US006981191B2

(12) United States Patent
Dorsey

(10) Patent No.: US 6,981,191 B2
(45) Date of Patent: Dec. 27, 2005

(54) ASIC LOGIC BIST EMPLOYING REGISTERS SEEDED WITH DIFFERING PRIMITIVE POLYNOMIALS

(75) Inventor: Michael C. Dorsey, San Diego, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 390 days.

(21) Appl. No.: 09/976,708

(22) Filed: Oct. 12, 2001

(65) Prior Publication Data

US 2003/0074621 A1    Apr. 17, 2003

(51) Int. Cl.[7] ............................................. G01R 31/28
(52) U.S. Cl. ...................................... 714/733; 714/739
(58) Field of Search ................................ 714/727, 726, 714/729, 728, 739, 732, 733

(56) References Cited

U.S. PATENT DOCUMENTS

| | | | | |
|---|---|---|---|---|
| 4,959,832 | A | * | 9/1990 | Bardell, Jr. .................. 714/739 |
| 5,260,950 | A | * | 11/1993 | Simpson et al. ............. 714/727 |
| 5,357,523 | A | * | 10/1994 | Bogholtz et al. ............ 714/718 |
| 5,369,648 | A | * | 11/1994 | Nelson ......................... 714/739 |
| 5,570,375 | A | * | 10/1996 | Tsai et al. ..................... 714/727 |
| 5,617,531 | A | * | 4/1997 | Crouch et al. ................ 714/30 |
| 5,661,732 | A | | 8/1997 | Lo et al. ....................... 714/725 |
| 5,825,785 | A | | 10/1998 | Barry et al. .................. 714/732 |
| 5,938,784 | A | * | 8/1999 | Kim .............................. 714/733 |
| 5,982,189 | A | * | 11/1999 | Motika et al. ................ 324/763 |
| 5,987,635 | A | | 11/1999 | Kishi et al. ................... 714/724 |
| 5,991,909 | A | * | 11/1999 | Rajski et al. ................. 714/729 |
| 6,085,346 | A | | 7/2000 | Lepejian et al. ............. 714/733 |
| 6,148,426 | A | | 11/2000 | Kim et al. .................... 714/733 |
| 6,205,564 | B1 | | 3/2001 | Kim et al. ..................... 714/48 |
| 6,249,893 | B1 | | 6/2001 | Rajsuman et al. ........... 714/741 |
| 6,442,723 | B1 | | 8/2002 | Koprowski et al. .......... 714/732 |
| 6,560,740 | B1 | | 5/2003 | Zuraski, Jr. et al. ......... 714/733 |
| 6,587,979 | B1 | | 7/2003 | Kraus et al. .................. 714/720 |
| 6,629,281 | B1 | * | 9/2003 | McNamara et al. .......... 714/733 |
| 6,636,997 | B1 | * | 10/2003 | Wong et al. .................. 714/728 |
| 6,654,920 | B1 | | 11/2003 | Hetherington et al. ...... 714/733 |
| 6,658,611 | B1 | | 12/2003 | Jun .............................. 714/719 |

(Continued)

FOREIGN PATENT DOCUMENTS

EP    0848329    6/1998    ................. 714/725

OTHER PUBLICATIONS

U.S. Appl. No. 09/976,554, filed Oct. 12, 2001.

(Continued)

*Primary Examiner*—Albert Decady
*Assistant Examiner*—John P. Trimmings
(74) *Attorney, Agent, or Firm*—Meyertons Hood Kivlin Kowert & Goetzel, P.C.; B. Noël Kivlin

(57) ABSTRACT

A method and apparatus for performing a built-in self-test ("BIST") on an integrated circuit device are disclosed. A BIST controller comprises a logic built-in self-test ("LBIST") engine capable of executing a LBIST and storing the results thereof and a multiple input signature register ("MISR"). The LBIST engine includes a LBIST state machine; and a pattern generator seeded with a first primitive polynomial. The MISR is capable of storing the results of an executed LBIST, the contents thereof being stored per a second primitive polynomial. A method for performing a LBIST comprises seeding a pattern generator in a LBIST engine with a first polynomial; executing a LBIST using the contents of the pattern generator; and storing the results of an executed LBIST in a MISR utilizing a second primitive polynomial.

33 Claims, 6 Drawing Sheets

U.S. PATENT DOCUMENTS

| | | | | |
|---|---|---|---|---|
| 6,658,617 B1 | 12/2003 | Wong | ............................ | 714/733 |
| 6,661,266 B1 | 12/2003 | Variyam et al. | .............. | 327/159 |
| 6,665,828 B1 * | 12/2003 | Arimilli et al. | .............. | 714/726 |
| 6,671,838 B1 | 12/2003 | Koprowski et al. | .......... | 714/726 |
| 6,681,359 B1 * | 1/2004 | Au et al. | ..................... | 714/733 |
| 6,684,358 B1 | 1/2004 | Rajski et al. | ................. | 714/739 |
| 6,701,476 B2 * | 3/2004 | Pouya et al. | .................. | 714/727 |
| 6,738,939 B2 * | 5/2004 | Udawatta et al. | ............ | 714/726 |

OTHER PUBLICATIONS

U.S. Appl. No. 09/976,701, filed Oct. 12, 2001.
U.S. Appl. No. 09/976,491, filed Oct. 12, 2001.
U.S. Appl. No. 09/976,707, filed Oct. 12, 2001.
U.S. Appl. No. 09/976,490, filed Oct. 12, 2001.
U.S. Appl. No. 09/976,523, filed Oct. 12, 2001.

* cited by examiner

ASIC LOGIC BIST EMPLOYING REGISTERS SEEDED WITH DIFFERING PRIMITIVE POLYNOMIALS

BACKGROUND OF THE INVENTION

1. Field of the Invention

The present invention pertains to built-in self-testing ("BIST") of application specific integrated circuit ("ASIC") devices, and, more particularly, to a logic built-in self-testing ("LBIST") employing registers seeded with differeing primitive polynomials.

2. Description of the Related Art

The evolution of computer chips typically spawns ever more complex integrated circuits. Manufacturers continually seek to fabricate more and smaller integrated circuit components in smaller areas. The effort pushes the abilities of technology in a number of areas including design, fabrication, and testing. In particular, as integrated circuits become more complex, they become more difficult to test, as do the computer chips, or "devices," into which they are fabricated.

The difficulty in testing integrated circuit devices affects not only the manufacturer. Frequently, a chip vendor will contract with a manufacturer to make chips on specification for them to sell. Just as the manufacturer wants to test the devices to make sure they meet applicable quality standards, the vendors want to make sure the devices they purchase meet the standards they set. This common concern has led the industry to develop several conventional approaches to testing integrated circuit devices.

One approach to testing integrated circuits is "built in self-testing," or "BIST." In BIST, in addition to "core" integrated circuits that provide the functionality of the device, the device includes integrated circuitry dedicated to testing. In this sense, the testing capability is "built-in" to the integrated circuit device. On receiving a predetermined signal, the BIST circuitry tests the core integrated circuitry and indicates whether it functions as designed. In this sense, the integrated circuit is self-testing in that it performs the test itself upon receipt of the externally generated test signal.

BIST comes in at least two variations. One is "memory" BIST, or "MBIST," and the other is "logic" BIST, or "LBIST." The MBIST tests the memory components of the device and the LBIST tests the logic on the device. An industry group called the Joint Test Action Group ("JTAG") developed an industry standard for interfacing with integrated circuit devices during tests. The JTAG standard is used with both variations of BIST. The integrated circuit device is manufactured with a JTAG "tap controller." The device is then tested in a live system or placed upon a chip tester. The live system or the chip tester generates a JTAG BIST signal input to the JTAG tap controller, which then begins the BIST. LBIST and MBIST can be used separately or in conjunction. The results of the BIST then tell the operator (if in a live system) or the vendor or manufacturer (if in a chip tester) whether and to what degree the device functions.

While BIST has many advantages and many uses, it also has some drawbacks. The logic and wiring with which the BIST are implemented take up valuable "real estate" on the die of the device. They also complicate the placement of device components and the routing of the connections between them. One reason for this complication is that the logic and circuitry implementing the BIST are distributed across the die. Another reason is that, during the design process, the LBIST and the MBIST are designed as separate "modules," or black boxes defined by their functions. Still anther reason is that LBIST and MBIST operate in different time domains, and require separate clock signals.

SUMMARY OF THE INVENTION

The invention includes, in its many aspects, a method and apparatus for performing a built-in self-test ("BIST") on an integrated circuit device. More particularly, in a first aspect, the invention includes a BIST controller. The BIST controller comprises a logic built-in self-test ("LBIST") engine capable of executing a LBIST and a multiple input signature register ("MISR"). The LBIST engine includes a LBIST state machine; and a pattern generator seeded with a first primitive polynomial. The MISR is capable of storing the results of an executed LBIST, the contents thereof being stored per a second primitive polynomial. In a second aspect, the invention includes a method for performing a LBIST. The method comprises seeding a pattern generator in a LBIST engine with a first polynomial; executing a LBIST using the contents of the pattern generator; and storing the results of an executed LBIST in a MISR utilizing a second primitive polynomial.

BRIEF DESCRIPTION OF THE DRAWINGS

The invention may be understood by reference to the following description taken in conjunction with the accompanying drawings, in which like reference numerals identify like elements, and in which:

FIG. 4 illustrates one particular embodiment of a multiple input signature register ("MISR") of the LBIST domain of FIG. 2, the contents of which is the LBIST signature;

FIG. 5 illustrates one particular embodiment of a register used in a pattern generator for the LBIST engine in the LBIST domain of FIG. 2;

FIG. 7 illustrates one particular embodiment of a MBIST signature register of the MBIST domain of FIG. 2, the contents of which is the MBIST signature in accordance with one aspect of the present invention;

Figure 1:
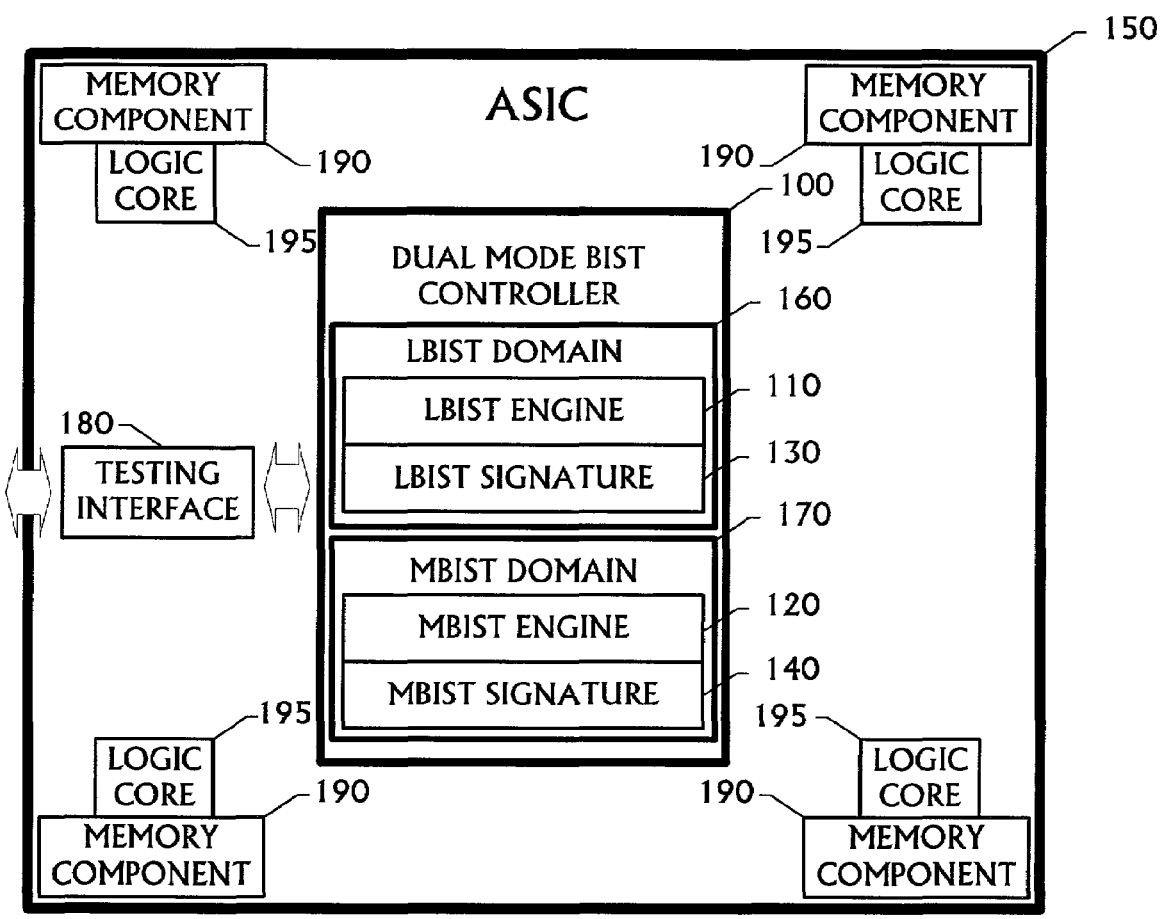
FIG. 1 conceptually illustrates a dual mode BIST controller constructed and operated in accordance with the present invention in a block diagram of an application specific integrated circuit ("ASIC")

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

FIG. 1 conceptually illustrates a dual mode built-in self-test ("BIST") controller 100 constructed and operated in accordance with the present invention. In the illustrated embodiment, the controller 100 comprises a logic BIST ("LBIST") engine 110, a memory BIST ("MBIST") engine 120, a LBIST signature 130, and a MBIST signature 140 separated into a LBIST domain 160 and a MBIST domain 170. Note that some embodiments may omit the MBIST signature 140 in accordance with conventional practice. The LBIST signature 130 and the MBIST signature 140 are the contents of memory elements of the BIST controller 100, such as registers, as is discussed further below.

The controller 100 comprises a portion of an integrated circuit device, i.e., an application specific integrated circuit ("ASIC") 150. The ASIC 150 includes a testing interface 180, preferably a Joint Test Action Group ("JTAG") tap controller, through which the BIST of the dual mode BIST controller 100 can be invoked and through which the results may be returned in accordance with conventional practice. The ASIC 150 also includes one or more memory components 190, preferably synchronous random access memories ("SRAMs"), and combinatorial logic 195 that are tested by the BIST of the dual mode BIST controller 100.

The dual mode BIST controller 100 includes three frequency domains—one in the LBIST domain 160, one in the MBIST domain 170, and a third in which the signals from the testing interface 180 operate. In one particular embodiment, the LBIST domain 160 operates on a 10 MHz clock signal, the MBIST domain 170 operates on a 75 MHz clock signal, and the third domain operates at a 10 MHz clock signal in accordance with the JTAG standard. In this particular embodiment, the 75 MHz clock signal is obtained by splitting the 150 MHz clock signal, as will be discussed further below, and the 10 MHz LBIST clock signal is generated based on the 10 MHz JTAG clock signal.

In accordance with the present invention, the LBIST clock signal (not shown) operates at the lowest frequency of any of the logic involved in the LBIST. This includes the combinatorial logic under test, e.g., the combinatorial logic in the timing domains 195a–d, or in the control logic, i.e., the testing interface 180. Typically, the combinatorial logic of the ASIC core operates on several different frequencies defining different timing domains such as the timing domains 195a–d. These frequencies may be different from those employed by the control logic. Consider, for instance, an embodiment where the testing interface 180 operates at 10 MHz in accordance with the JTAG standard; the timing domain 195a operates at 150 MHz; and, the timing domains 195b–d operate at a variety of frequencies ranging from 66 MHz to 133 MHz. The LBIST performed by the LBIST engine 110 will, in this particular implementation, be performed in all timing domains 195a–d at 10 MHz, which is the slowest frequency, to avoid timing errors. Thus, the present invention employs a slow LBIST to preserve timing integrity across all the timing domains while reducing the number of LBIST engines 110 needed to perform the LBIST on any given ASIC.

Because the dual mode BIST controller 100 can perform both the LBIST and the MBIST, all BIST functionality can be centralized in one location. Thus, the BIST functionality of the ASIC 150 can be designed in a single module. Note that the manner in which the clock signal for the MBIST domain 170 is implemented facilitates this feature. Furthermore, the BIST functionality can usually be designed in the geographic center of the ASIC 150. This feature facilitates the placement of other components, e.g., the memory components 190 and the logic 195, and the routing of connections. As will be appreciated by those skilled in the art having the benefit of this disclosure, the memory components 190 are typically large relative to other components of the ASIC 150. Their placement therefore tends to dictate the location of other components, e.g., the dual mode BIST controller 100, on the ASIC 150. Consequently, in some embodiments, the dual mode BIST controller 100 might not be located at the geographical center of the ASIC 150. However, most design techniques will result in the memory components being located at the corners of the ASIC 150, as shown in FIG. 1. The dual mode BIST controller 100 may therefore usually be geographically centralized.

Figure 2:
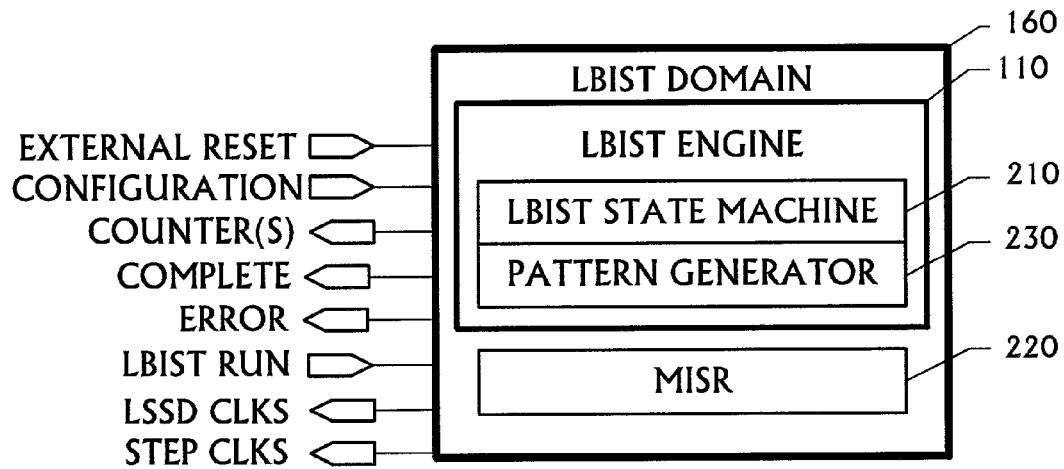
FIG. 2 depicts one particular embodiment of the LBIST domain of the dual mode BIST controller in FIG. 1 in a block diagram.

One particular embodiment of the LBIST domain 160 is conceptually illustrated in FIG. 2. In this particular embodiment, the LBIST engine 110 comprises an LBIST state machine 210 and a pattern generator 230. The LBIST domain 160 also includes a multiple input signature register ("MISR") 220. The content of the MISR 220 is the LBIST signature 130 in FIG. 1. The pattern generator 230 is, more precisely, a pseudo random pattern generator ("PRPG"). In the illustrated embodiment, the LBIST engine 110 is externally configured by a CONFIGURATION signal with a vector count and a PRPG seed for the pattern generator 230. The LBIST engine 110 is configured by a 65-bit signal received through the testing interface 180 in which 32 bits contain the vector count and 33 bits contain the PRPG seed. Thus, the pattern generator 230 is programmable, as is the LBIST engine 110 as a whole. However, the invention is not so limited and other techniques may be employed for configuring the LBIST engine 110. For instance, these values may be hardcoded or hardwired in alternative embodiments.

In the illustrated embodiment, the LBIST engine 110 is also provided with the scan chain length in the ASIC 150. The value is, in this particular embodiment, hardwired to a value greater than the longest scan chain length in the ASIC 150. This value may be different for each implementation of the ASIC 150 and may be hard coded by the ASIC vendor. Furthermore, in some alternative embodiments, this value may be provided to the LBIST engine 110 through the testing interface 180.

Figure 3:
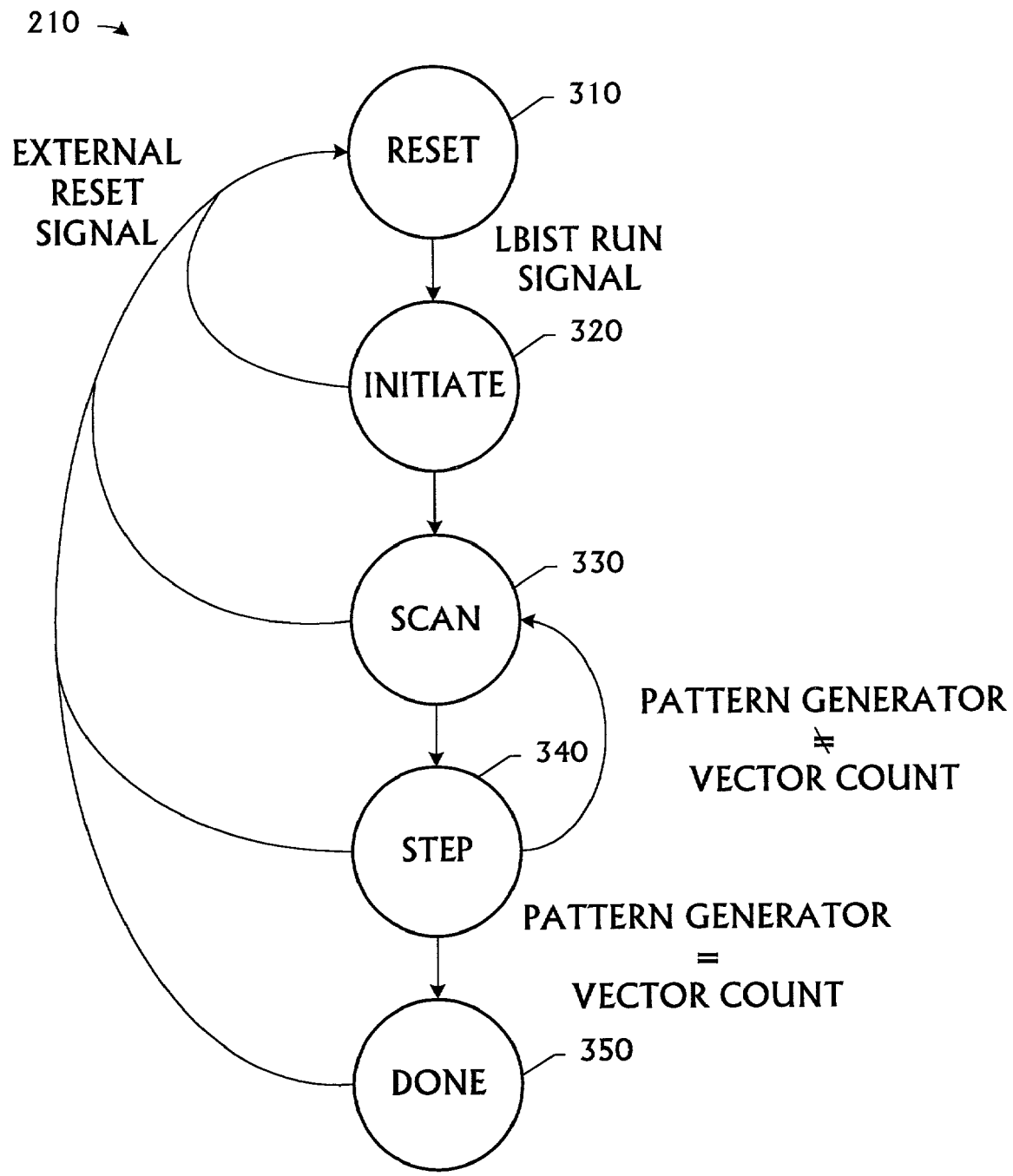
FIG. 3 illustrates one particular embodiment of a state machine for the LBIST engine in the LBIST domain of FIG. 2.

Turning now to FIG. 3, the LBIST state machine 210 has five primary states: a reset state 310, an initialization state 320, a scan state 330, a step state 340, and a done state 350. The LBIST state machine 210 is reset, i.e., transitions to the reset state 310, whenever an external reset signal is asserted regardless of which state in which it might be. On transition to the reset state 310, the MISR 220 and the pattern generator 230 are initialized. The LBIST state machine 210 remains in the reset state 310 until the LBIST RUN signal is received, whereupon it transitions to the initiate state 320. In the initiate state 320, the LBIST initiates the various signals to be used in the LBIST. For instance, the COUNTER(S), COMPLETE, and ERROR signals, whose functions shall be discussed more fully below, are initialized. The LBIST state machine 210 then automatically transitions to the scan state 330 and begins to repeatedly cycle through the scan state 330 and the step state 340. Note that, in the early cycles, the scan state 340 flushes the scan chains (not shown) and the MISR 220 is not loaded, in the illustrated invention, until after the scan chains flush.

The scan state 330 and the step state 340, together, comprise the actual LBIST. The LBIST state machine 210 cycles through the scan state 330 and the step state 340 until reset by the external reset signal or until the LBIST is complete. The LBIST can be performed repeatedly without resetting through the external reset signal. Prior to entering the done state 350, the LBIST state machine 210 cycles through the scan state 330 and the step state 340 a number of times based on the vector count. As mentioned above, in the illustrated embodiment, the vector count is externally configured. The LBIST state machine 210 of the illustrated embodiments cycles through the scan state 330 and the step state 340 until the content of the pattern generator 230 is equal to the vector count. However, alternative embodiments may base the number of cycles on the vector count in alternative manners.

If the LBIST completes without being externally reset, the LBIST state machine 210 transitions to the done state 350. In the done state 350, the LBIST engine 110 provides a "BIST complete" indicator signal COMPLETE. The COMPLETE indicator signal also indicates that the results are "fresh," i.e., from the current LBIST and not from an old run. In accordance with one aspect of the present invention, the indicator signal COMPLETE sets a designated bit in the MISR 220 to indicate that the LBIST is complete in the LBIST signature 130. Thus, the LBIST signature 130 includes an indication of whether the LBIST is done. The LBIST engine 110 also provides an error signal ERROR, indicating the pattern generator 230 went to an "all zeros state," which is highly undesirable. Also in accordance with one aspect of the present invention, the ERROR signal sets a designated bit in the MISR 220 to indicate in the LBIST signature 130 that this error condition arose during the LBIST. Note that alternative embodiments of the present invention may omit one or both of the "done" and "error" indications in the LBIST signature 130 should they choose not to implement these aspects of the present invention.

Figures 4, 5, 7:
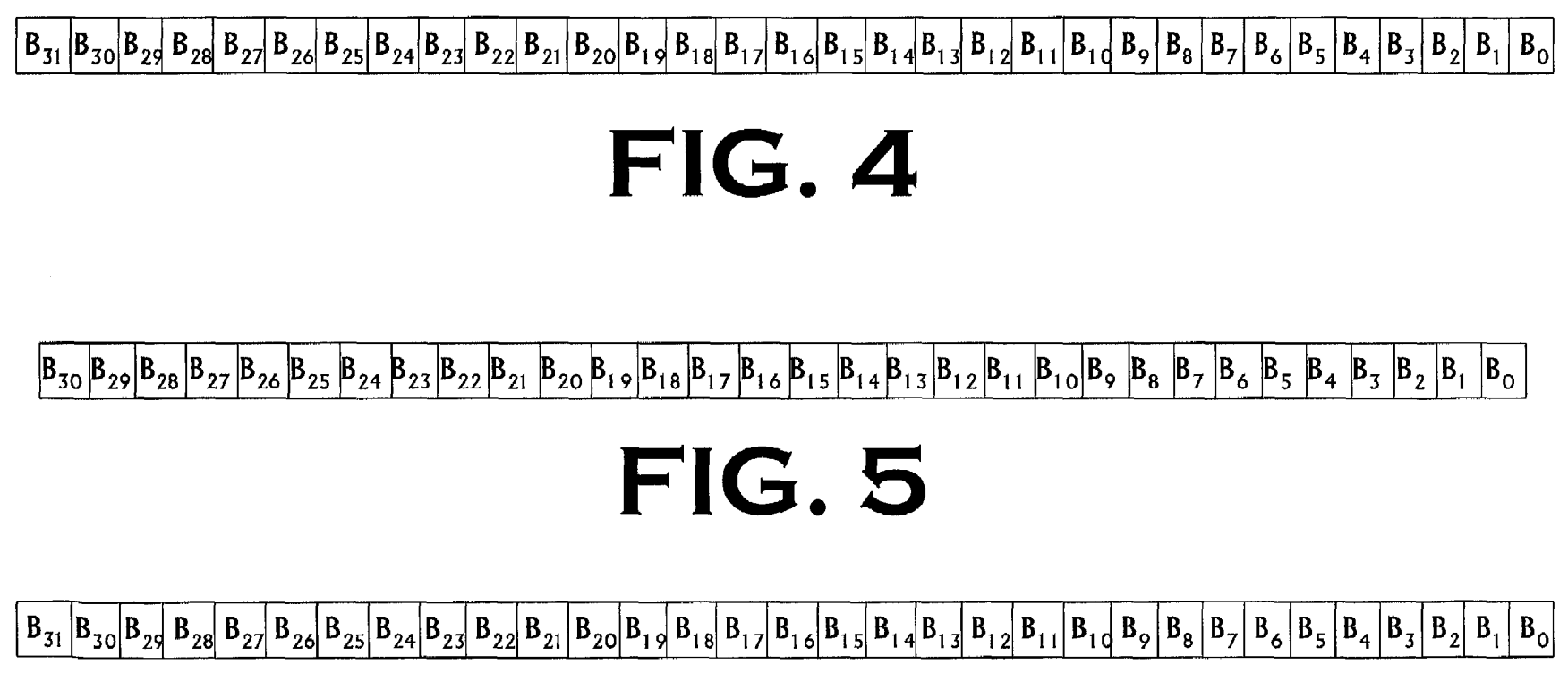

The MISR 220 is, in the illustrated embodiment, a 32-bit register shown in FIG. 4. The MISR 220 is initialized when the LBIST state machine 210 resets and shifts during the scans. The MISR 220 may be implemented using any techniques known to the art. However, as was mentioned above, in the illustrated embodiment, one bit, e.g., the bit $B_{32}$, is used to indicate that the LBIST is done/fresh and one bit, e.g., the bit $B_{33}$, is used to indicate that an error condition arose. Furthermore, in accordance with yet another aspect of the present invention, the done bit of the MISR 220, e.g., the bit $B_{32}$, is used to indicate that the LBIST signature 130 stored in the MISR 220 is new or valid, and not the result of a previous run. For instance, this bit may be cleared when the LBIST state machine 210 enters the reset stage 310 and the MISR 220 is initiated, and then set when the LBIST state machine 210 enters the done state 350. Note that the MISR 220 can be implemented using registers having sizes other than 32 bits. The logic pattern held in the bits $B_{31}$–$B_0$ in the MISR 220 can then be externally compared to a known pattern after the LBIST is done to establish pass/fail results.

The pattern generator 230 is implemented, in the illustrated embodiment, in a 31-bit linear feedback shift register ("LFSR"), shown in FIG. 5, such as is known to the art. the pattern generator 230 may be implemented using any suitable technique known to the art. However, in the illustrated embodiment, the pattern generator 230 is initialized to the externally configured PRPG seed when the LBIST state machine 210 enters the reset state 310. Selected outputs of the LFSR supply the scan pattern to the inputs of the scan chains (not shown) in a conventional fashion. During scan, the LFSR continuously shifts from the most significant bit ("MSB") $B_{30}$ to the least significant bit ("LSB") $B_0$.

In accordance with yet another aspect of the invention, the content of the LFSR with which the pattern generator 230 is implemented and the register with which the MISR 220 is implemented are generated using different primitive polynomials to prevent failures disguised by aliasing. The content of the LFSR in the illustrated embodiment is based on the 31-bit primitive polynomial $x^{31}+x^3+1$ and the content of the MISR 220 is based on the 32-bit primitive polynomial $x^{32}+x^{18}+1$. If the pattern generator 230 enters an all zero state, the error indicator will be activated and stored in bit B33 of the MISR 220. In this particular embodiment, the even outputs of the LFSR (bits B30 to Bo) supply the scan pattern to the inputs of the scan chains 1 to 23, respectively. The MISR 220 has inputs that EXCLUSIVEOR into the odd register bits B7 through B31 and bit B0 during the scan operation. Alternative embodiments may omit this aspect of the invention, however.

Figure 9:
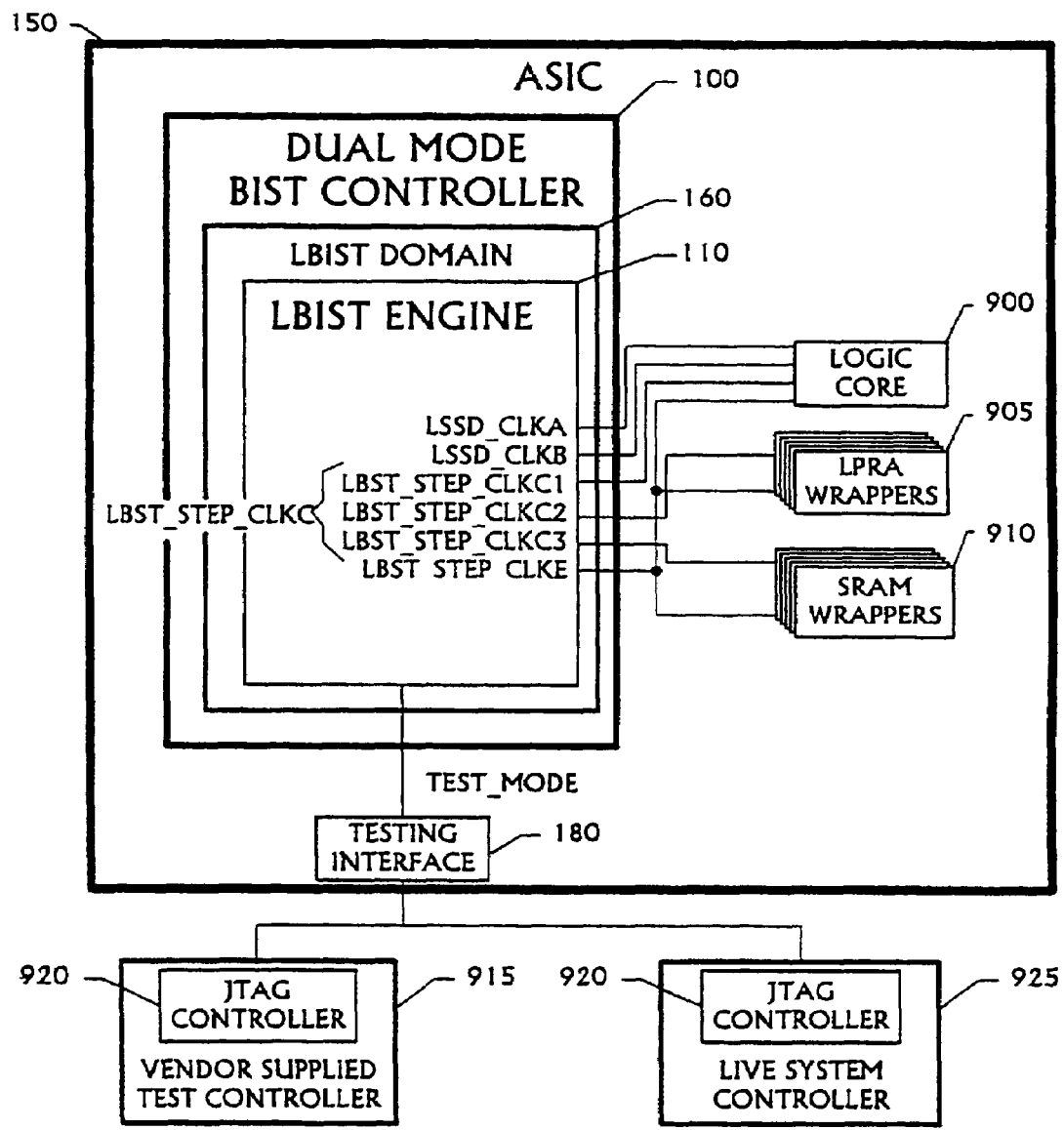
FIG. 9 illustrates the LBIST engine of FIG. 1 and FIG. 2 providing clock signals to other parts of the ASIC in FIG. 1 in one particular embodiment of the invention.

The LBIST engine 110 provides two level sensitive scan device ("LSSD") clock signals, shown in FIG. 9, to the level sensitive scan devices (not shown) in the core 900. Both of these clock signals are normally low, but alternately pulse high when the LBIST state machine 210 is in the scan state 330. After the scan chains are flushed, the MISR 220 (shown in FIG. 2) collects the scan data. The LBIST engine 110 also outputs two step clock signals LBIST STEP CLKC and LBST STEP CLKE. The step clock signal LBIST STEP CLKC actually comprises three signals LBIST_STEP CLKC1, LBIST STEP CLKC2, and LBIST STEP CLKC3. The LBST_STEP CLKE clock signal, normally high, enables the LBST STEP CLKC1 through to the core latches (not shown) via the core logic clock signal splitters (not shown) of the core 900. The LBST STEP CLKC2 is enabled by the LBST STEP CLKE clock signal through the clock signal splitters (not shown) of the low power register array ("LPRA") wrappers 905. The LBST STEP CLKE clock signal also enables the LBST STEP CLKC3 through the clock signal splitter (not shown) of the wrappers for the memory components 190, i.e., the SRAM wrappers 910.

Clock control is technically not a function within LBIST. Vendor ASICS have a primary input pin (not shown) on which they receive a TEST_MODE signal from the test controller 915 through the testing interface 180. When this signal is high, the LBIST is completely inhibited from affecting operation of vendor chip testers. During vendor chip LSSD testing, this input is held high. During normal operation, TEST_MODE is low. A signal received through the testing interface 180, e.g., a LBST_SEL signal from a joint test access group ("JTAG") controller 920, determines if the LBIST can supply the scan clock signals and step clock signals. The LBST_SEL signal controls a multiplexer (not shown) between the system clock signal received through the testing interface 180 and the LBIST step clock signals. It also controls multiplexers (not shown) between the LSSD clock signals and the outputs of the clock signal splitters driven by the LBIST step clock signals as discussed above.

In the illustrated embodiment, the LBIST runtime is a function of the vector count provided the LBIST engine 110 and the hardwired scan length value discussed above. The number of clock cycles can be computed as:

$$([\text{vector count} \times (4 + (2 \times \text{scan length value}))] + 2$$

The clock rate is determined by a clock signal provided through the testing interface 180, e.g., the JTAG TCK.

Figure 6:
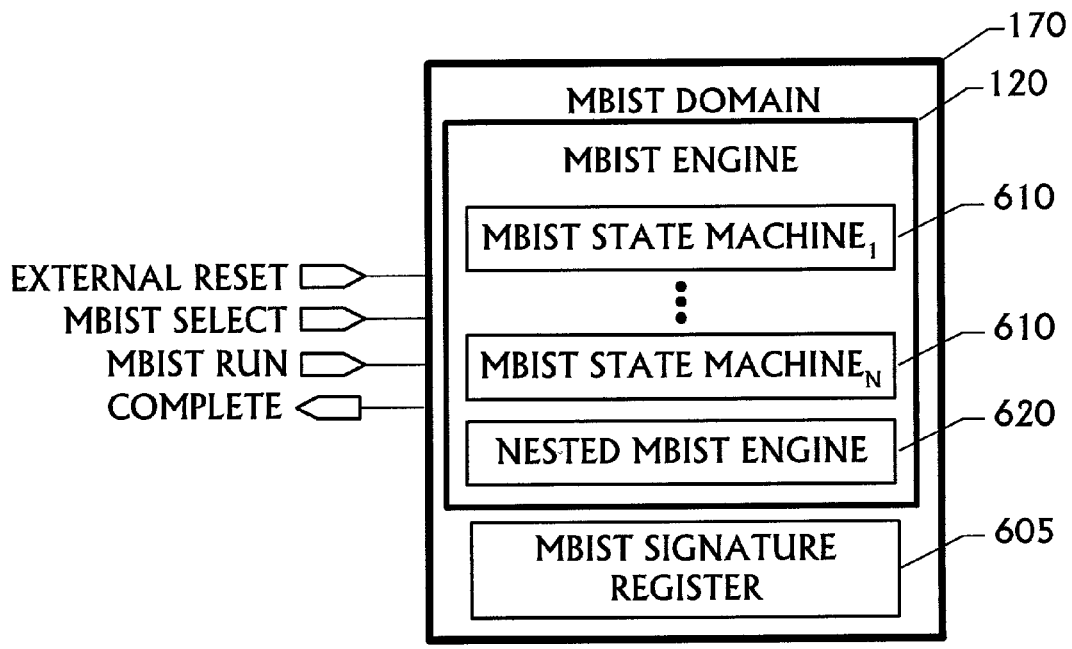
FIG. 6 illustrates one particular embodiment of the MBIST domain of the dual mode BIST controller in FIG. 1 in a block diagram.

Turning now to FIG. 6, the MBIST domain 170, first shown in FIG. 1, includes the MBIST engine 120 and a MBIST signature register 605 whose content is the MBIST signature 140. The MBIST engine 120, in the illustrated embodiment, comprises a series of alternative MBIST state machines 610—one of which drives a nested MBIST engine 620 in accordance with yet another aspect of the invention. In this particular embodiment, the nested MBIST engine 620 is provided by an ASIC vendor, and one of the MBIST state machines 610 is designed to operate with that particular vendor-supplied, nested MBIST engine 620. Indeed, each of the MBIST state machines 610 is designed to operate with one or more alternative vendor-supplied nested MBIST engines 620 that may be nested in the MBIST engine 120. The MBIST state machines 610 may also be modifiable to facilitate operation with vendor-supplied MBIST engines 620 that were not anticipated at the time the ASIC 150 was designed.

The MBIST engine 120 is therefore modifiable or configurable at the time the ASIC is implemented in a register transfer level ("RTL") specification to accommodate a variety of nested MBIST engines 620 that might be obtained from various vendors. As those in the art having the benefit of this disclosure will appreciate, the nested MBIST engine 620 and the MBIST state machines 610 are a predefined library elements in standard RTL applications software. The RTL specification for the ASIC 100 contains a logic wrapper (not shown) defining the inputs and outputs for the library elements that define which of the MBIST state machines 610 provides the input and output to the nested MBIST engine 620. The RTL specification is then synthesized into a gate-level implementation for the ASIC 100.

The illustrated embodiment is therefore versatile with respect to which vendor-supplied MBIST engines 620 may be used. However, such versatility may not be desired in all embodiments. Some embodiments of the present invention may therefore include only a single MBIST state machine 610. Or, the versatility may be incorporated into a single MBIST state machine 610 that is highly modifiable or configurable. The number of MBIST state machines 610 employed in any given embodiment will therefore be implementation specific.

In accordance with still another aspect of the present invention, the results of the MBIST on the memory components 190 are stored as the MBIST signature 140, shown in FIG. 1, within the MBIST signature register 605. The structure and function of the MBIST signature 140 are analogous to the structure and function of the LBIST signature 130. The MBIST signature register 140 is also a multiple input signature register, but its contents differ from the MISR 220. The MBIST signature register 140 will therefore be loaded differently from the MISR 220. In this particular embodiment, paranoid checks and MBIST engine states are stored in the MBIST signature register 605 for debug purposes. One bit of the MBIST signature register 605, e.g., the bit $B_{31}$, shown in FIG. 7, of this register is a "done" bit. The done bit indicates if the MBIST is done and, hence, if the results stored are new or resulted from a previous run.

The nested MBIST engine 620 tests from one to sixteen memory components 190 (not shown) in parallel depending on the specification of the ASIC vendor. The dual mode BIST controller 100 has a separate clock domain for the MBIST engine 120 in which the 150 MHz system clock signal is halved and the MBIST engine 120 is driven with the resultant 75 MHz clock signal. The results of the tests on the SRAMs are stored in the MBIST signature register 605. Bit $B_{31}$ of this register is the "done" bit. The done bit indicates if the results stored are new or resulted from a previous run. In this particular embodiment, paranoid checks and MBIST engine states are also stored in the MBIST signature register 605 for debug purposes.

Figure 8:
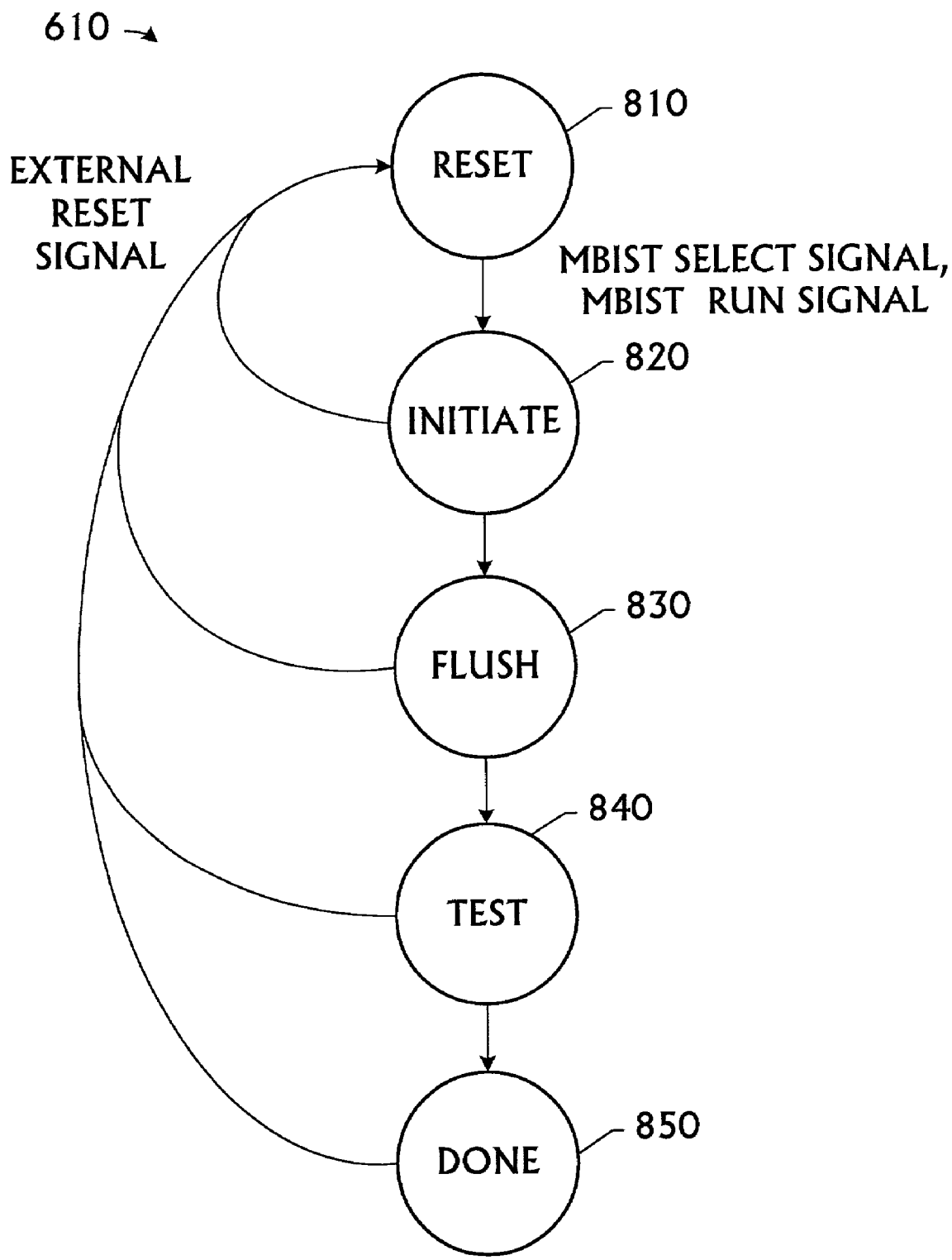
FIG. 8 illustrates one particular embodiment of a state machine for an MBIST engine in the MBIST domain of FIG. 2.

Each of the MBIST state machines 610 has, as is shown in FIG. 8, five states: a reset state 810, an initialization state 820, a flush state 830, a test state 840, and a done state 850. The MBIST engine 120 is reset to the reset state 810 by asserting the external reset signal. Note that, in this particular embodiment, the same external reset signal resets both the LBIST engine 110 and the MBIST engine 120.

The MBIST state machine 610 transitions to the initialization state 820 upon receipt of a MBIST select signal and a MBIST run signal received through the testing interface 180. The initialization state 820 is followed by a flush and then the test patterns as the MBIST engine 120 cycles through the initialization state 820, flush state 830, and test state 840. This transition occurs upon the completion of initialization of components and signals in the MBIST domain. The flush state 830 continues until the memory components 190 are flushed and initialized them to a known state. The MBIST state machine 610 then transitions to the test state 840. The MBIST engine 120 drives a one direction test pattern bus (not shown) out to all memory components 190, and they drive the result back to the nested MBIST engine 620 on another direction test pattern bus. The results are stored in the MBIST signature register 605 as part of the MBIST signature 140. When the MBIST is completed, the MBIST state machine 610 transitions to the done state 850, signaling completion by setting the dedicated bit in the MBIST signature register 605 to indicate the MBIST is complete.

As was mentioned above, the nested MBIST engine 620 is, in the illustrated embodiment, a vendor-supplied MBIST engine such as vendors use in their testers. The states 810, 820, 830, 840, and 850 of the individual MBIST state machines 610 may be implemented in accordance with conventional practice. Furthermore, the operation of the MBIST state machines 610 will be implementation specific depending on the implementation of the nested MBIST engine 620.

More particularly, in the illustrated embodiment, the memory components 190 are SRAMs and the testing interface 180 is a JTAG tap ("JTTAP") implemented as is known in the art. The MBIST engine 120 is reset by asserting the external reset signal received through the testing interface 180. With the JTAG Tap (not shown) controller signals of MBST_SEL and MBST_RUN, the MBIST engine 120 is initialized. Initialization is followed by flush and then the test patterns as the MBIST engine 120 cycles through the initialization state 820, flush state 830, and test state 840. The flush state 830 occurs, in the illustrated embodiment, for 1024, 75 MHz cycles and initializes the SRAM to a known state. Flush state MUX gates (not shown) are hand-instantiated within the SRAM wrappers 910 to hold the SCAN_IN IO (on which the dual mode BIST controller 100 outputs scan patterns) to a 1'b0, the first and second scan clock signals are both held to a 1'b1 as the SRAM is flushed to all zeros. Watchdog timers (not shown) are part of paranoid logic in the MBIST engine 120 to prevent the nested MBIST engine 620 from free running or having any destructive effects during normal functionality. The MBIST engine 120 drives a one direction test pattern bus (not shown) out to all SRAMs, and the SRAMs drive the result back to the nested MBIST engine 620.

In operation, the ASIC 150 shown in FIG. 1 may be placed on a vendor-supplied tester 915, shown in FIG. 9, typically with several other ASICs 150 (not shown). Alternatively, the ASIC 150 may be tested in a live system including a live system controller 915 including a JTAG controller 920. The MBIST engine 120 includes a MBIST state machine 610, shown in FIG. 6, designed for use with this particular vendor-supplied tester 915. In the illustrated embodiment, the JTAG controller 920 employs JTAG protocols and testing hardware, and so the testing interface 180 is a JTTAP controller. As was noted above, the LBIST and MBIST capabilities of the dual mode BIST controller 100 may be utilized separately or conjunctively. Furthermore, the LBIST and the MBIST may be performed in parallel or in serial. However, the following discussion will contemplate a conjunctive use in serial. It is nevertheless to be understood that only one or the other may be employed in alternative embodiments.

The JTAG controller 920, shown in FIG. 9, of the vendor-supplied test controller 915 or the live system controller 925 provides the configuration data including the vector count and the PRPG seed to the LBIST domain 160 through the testing interface 180. The testing interface 180, under the control of the JTAG controller 920, then supplies the external reset signal, shown in FIG. 2 and FIG. 6, to the LBIST domain 160 and the MBIST domain 170. The LBIST state machine 210 and the MBIST state machine 610 then each transition to their respective reset states 310, 810.

The testing interface 180, again under control of the JTAG controller 920, generates the LBIST run signal, whereupon the LBIST state machine 320 transitions into the initiate state 320. The LBIST engine 110 then initiates as was discussed above. The LBIST state machine 110 then cycles through the scan and step states 330, 340 as discussed above until the LBIST is complete, i.e., the value of the pattern generator 230 is equal to the configured vector count. As the LBIST is run, the results are stored in the MISR 220. When the LBIST is complete, the LBIST state machine 210 transitions to the done state 350. The LBIST engine 110 then generates a "complete" signal that sets a bit in the MISR 220 to indicate that the LBIST has successfully completed. If, for some reason, the pattern generator 230 goes to all zeroes, the error signal is instead generated and the LBIST aborted.

The testing interface 180 then generates the MBIST run and MBIST select signals, whereupon the MBIST state machine 610 transitions to the initialize state 820. The MBIST engine 120 initializes its components and signals as was discussed above. The MBIST state machine 610 then cycles through the flush and test states 830, 840 as discussed above using the nested MBIST engine 620. As the MBIST is run, the results of the paranoid checks and the MBIST engine states are stored in the MBIST signature register 605. When the MBIST is complete, the MBIST state machine 610 transitions to the done state 850, whereupon the MBIST engine 120 generates the complete signal, which sets a done bit in the MBIST signature register 605.

The dual mode BIST controller 100 permits all this functionality to be designed into a single module of the ASIC 150. This further facilitates the placement of other ASIC components and the wiring between them. The dual mode BIST controller 100 also permits the use of multiple clock domains in the same module. Because the results of both the LBIST and the MBIST are stored, the system controller 925 in the live system or the vendor-supplied test controller 915 can read out the results of the tests through the testing interface 180.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A built-in self-test controller, comprising:
   a logic built-in self-test engine capable of executing a logic built-in self-test, including:
      a logic built-in self-test state machine; and
      a pattern generator seeded with a first primitive polynomial; and
      a multiple input signature register capable of storing the results of an executed logic built-in self-test, the contents thereof being stored per a second primitive polynomial;
      wherein the first primitive polynomial has a first number of bits and the second primitive polynomial has a second number of bits, wherein the second number is different from the first number.

2. The built-in self-test controller of claim 1, wherein the first primitive polynomial is $x^{31}+x^3+1$.

3. The built-in self-test controller of claim 1, wherein the second primitive polynomial is $x^{32}+x^{28}+x+1$.

4. The built-in self-test controller of claim 1, wherein the logic built-in self-test state machine further comprises:
   a reset state entered upon receipt of an external reset signal;
   an initiate state entered from the reset state upon receipt of a logic built-in self-test run signal;
   a scan state entered from the initiate state upon the initialization of components and signals in the logic built-in self-test domain in the initiate state;
   a step state entered into from the scan state and from which the scan state is entered unless the content of the pattern generator equals a predetermined vector count; and
   a done state entered into when the content of the pattern generator equals the predetermined vector count.

5. The built-in self-test controller of claim 1, wherein the pattern generator comprises a linear feedback shift register seeded with a primitive polynomial.

6. The built-in self-test controller of claim 1, wherein the multiple input signature register includes at least one of:
   a bit indicating whether the logic built-in self-test is done;
   a bit indicating an error condition arose; and
   a bit indicating whether the stored results are from a previous logic built-in self-test run.

7. The built-in self-test controller of claim 1, wherein the seed for the pattern generator is externally configurable.

8. A built-in self-test controller, comprising:
   means for executing a logic built-in self-test, including a pattern generator seeded with a first primitive polynomial; and
   means for storing the results of an executed logic built-in self-test, the contents thereof being stored per a second primitive polynomial;
   wherein the first polynomial has a first number of bits and the second polynomial has a second number of bits, wherein the second number is different from the first number.

9. The built-in self-test controller of claim 8, wherein the first primitive polynomial is $x^{31}+x^3+1$.

10. The built-in self-test controller of claim 8, wherein the second primitive polynomial is $x^{32}+x^{28}+x+1$.

11. The built-in self-test controller of claim 8, wherein the seed for the pattern generator is externally configurable.

12. A integrated circuit device, comprising:
   a plurality of memory components;
   a logic core;
   a testing interface; and
   a built-in self-test controller, including:
      a logic built-in self-test engine capable of executing a logic built-in self-test and storing the results thereof, including: a logic built-in self-test state machine; and a pattern generator seeded with a first primitive polynomial; and
      a multiple input signature register capable of storing the results of an executed logic built-in self-test, the contents thereof being stored per a second primitive polynomial;
      wherein the first primitive polynomial has a first number of bits and the second primitive polynomial has a second number of bits, wherein the second number is different from the first number.

13. The integrated circuit device of claim 12, wherein the first primitive polynomial is $x^{31}+x^3+1$.

14. The integrated circuit device of claim 12, wherein the second primitive polynomial is $x^{32}+x^{28}+x+1$.

15. The integrated circuit device of claim 12, wherein the logic built-in self-test state machine further comprises:
   a reset state entered upon receipt of an external reset signal;
   an initiate state entered from the reset state upon receipt of a logic built-in self-test run signal;
   a scan state entered from the initiate state upon the initialization of components and signals in the logic built-in self-test domain in the initiate state;
   a step state entered into from the scan state and from which the scan state is entered unless the content of the pattern generator equals a predetermined vector count; and
   a done state entered into when the content of the pattern generator equals the predetermined vector count.

16. The integrated circuit device of claim 12, wherein the pattern generator comprises a linear feedback shift register seeded with a primitive polynomial.

17. The integrated circuit device of claim 12, wherein the multiple input signature register includes at least one of:
   a bit indicating whether the logic built-in self-test is done;
   a bit indicating an error condition arose; and
   a bit indicating whether the stored results are from a previous logic built-in self-test run.

18. The integrated circuit device of claim 12, further comprising: a memory built-in self-test engine; and a memory built-in self-test signature register capable of storing the results of the memory built-in self-test.

19. The integrated circuit device of claim 12, wherein the memory components include a static random access memory device.

20. The integrated circuit device of claim 12, wherein testing interface comprises a Joint Test Action Group tap controller.

21. The integrated circuit device of claim 12, wherein the seed for the pattern generator is externally configurable.

22. A method for performing a logic built-in self-test, the method comprising:
   seeding a pattern generator in a logic built-in self-test engine with a first primitive polynomial; and
   executing a logic built-in self-test using the contents of the pattern generator; and storing the results of an executed logic built-in self-test in a multiple input signature register utilizing a second primitive polynomial;
   wherein the first primitive polynomial has a first number of bits and the second primitive polynomual has a second number of bits, wherein the second number is different from the first number.

23. The method of claim 22, wherein seeding the pattern generator with the first primitive polynomial includes seeding the pattern generator with the polynomial $x^{31}+x^3+1$.

24. The method of claim 23, wherein storing the results of the executed logic built-in self-test utilizing the second primitive polynomial utilizes the primitive polynomial $x^{32}+x^{28}+x+1$.

25. The method of claim 22, wherein storing the results of the executed logic built-in self-test utilizing the second primitive polynomial utilizes the primitive polynomial is $x^{32}+x^{28}+x+1$.

26. The method of claim 22, wherein executing the logic built-in self-test includes:
   initiating a plurality of components and signals in a logic built-in self-test domain of a built-in self-test controller upon receipt of a logic built-in self-test run signal;
   scanning a scan chain upon the initialization of the components and the signals;
   stepping to a new scan chain; and
   repeating the previous scanning and stepping until the content of the pattern generator equals a predetermined vector count.

27. The method of claim 26, further comprising at least one of:
   setting a bit in a multiple input signature register indicating whether the logic built-in self-test is done;
   setting a bit in the multiple input signature register indicating an error condition arose; and
   setting a bit in the multiple input signature register indicating whether the stored results are from a previous logic built-in self-test run.

28. The method of claim 22, further comprising externally configuring the seed.

29. A method for testing an integrated circuit device, the method comprising:
   interfacing the integrated circuit device with a tester;
   performing a logic built-in self-test, including:
      seeding a pattern generator in a logic built-in self-test engine with a first primitive polynomial;
      executing a logic built-in self-test using the contents of the pattern generator; and storing the results of an executed logic built-in self-test in a multiple input signature register utilizing a second primitive polynomial; and reading the stored results;

wherein the first primitive polynomial has a first number of bits and the second primitive polynomial has a second number of bits, wherein the second number is different from the first number.

30. The method of claim 29, wherein seeding the pattern generator with the first primitive polynomial includes seeding the pattern generator with the polynomial $x^{31}+x^3+1$.

31. The method of claim 29, wherein storing the results of the executed logic built-in self-test utilizing the second primitive polynomial utilizes the primitive polynomial $x^{32}+x^{28}+x+1$.

32. The method of claim 29, further comprising externally configuring the seed.

33. The method of claim 29, further comprising performing a memory built-in self-test.

* * * * *